(12) United States Patent
Osipov et al.

(10) Patent No.: US 6,879,013 B2
(45) Date of Patent: Apr. 12, 2005

(54) AMPLIFIERS USING SPIN INJECTION AND MAGNETIC CONTROL OF ELECTRON SPINS

(75) Inventors: Viatcheslav V. Osipov, Mountain View, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/632,038

(22) Filed: Jul. 30, 2003

(65) Prior Publication Data

US 2005/0023630 A1 Feb. 3, 2005

(51) Int. Cl.$^7$ .................. H01L 35/24; H01L 51/00; G11C 7/00
(52) U.S. Cl. ................. 257/421; 257/14; 257/30; 257/295; 360/324; 360/324.1; 360/324.11; 360/324.12; 360/324.2; 360/325
(58) Field of Search ................. 257/9, 13, 14, 257/30, 40, 295, 421–427; 360/324–327.24; 365/169–175; 428/611

(56) References Cited

U.S. PATENT DOCUMENTS 6,355,953 B1 * 3/2002 Kirczenow .................. 257/295

OTHER PUBLICATIONS

Sarma, Sankar Das, "Spintronics" American Scientist, vol. 89, pp. 516–523 (Nov.–Dec. 2001).
Wolf, S.A. et al., "Spintronics: A Spin–Based Electronics Vision for the Future" Science, vol. 294, pp. 1488–1495 (Nov. 16, 2001).

* cited by examiner

*Primary Examiner*—Minhloan Tran
*Assistant Examiner*—Thomas L Dickey

(57) ABSTRACT

Ultrafast solid state amplifiers of electrical current, including power amplification devices, use injection of spin-polarized electrons from a magnetic region into another magnetic region through a semiconductor control region and electron spin precession inside the control region induced by a magnetic field resulting from a current flowing through a conductive nanowire. The amplifiers may include magnet-semiconductor-magnet heterostructures and are able to operate on electric currents and electromagnetic waves having frequencies up to 100 GHz or more.

29 Claims, 6 Drawing Sheets

AMPLIFIERS USING SPIN INJECTION AND MAGNETIC CONTROL OF ELECTRON SPINS

This patent document is related and hereby incorporates by reference in their entirety U.S. patent application Ser. No. 10/284,183, filed Oct. 31, 2002, entitled: "Efficient Spin-Injection Into Semiconductors"; U.S. patent application Ser. No. 10/284,360, filed Oct. 31, 2002, entitled: "Magnetic Sensor Based on Efficient Spin Injection into Semiconductor"; co-filed U.S. patent application Ser. No. 10/631,999, entitled "Spin Injection Devices"; and co-filed U.S. patent application Ser. No. 10/631,951, entitled "Square-Law Detector Based on Spin Injection and Nanowires."

BACKGROUND

Traditional semiconductor devices based on control of the flow and the density of electric charge (e.g., electrons or holes) are nearing a point where every new step towards miniaturization or towards increasing the operating speed demands new technology and huge investments. In particular, as semiconductor devices become smaller (e.g., near nanometer scale) or need to operate at faster speeds, the heat that electrical currents generate in semiconductor devices becomes a greater problem. Additionally, semiconductor devices are now reaching sizes at which previously ignored quantum-mechanical properties such as spin are significant. Dealing with these quantum-mechanical properties can be a challenge in the design of traditional semiconductor devices, but such quantum mechanical properties also provide the potential for alternative mechanisms for device operation.

One important quantum property of electrons is their intrinsic spin. The spin of an electron gives the electron an intrinsic magnetic moment that can interact with electromagnetic fields. The spin interactions of electrons therefore provide a potential mechanism for operational devices, and such devices can be very fast and may potentially generate less heat than do traditional devices. The field of spintronics has thus arisen from efforts to develop fast solid-state devices such as magnetic sensors and transistors of nanometer proportions that use the spins or the associated magnetic moments of electrons.

S. Datta and B. Das in "Electronic Analog of the Electrooptic Modulator," Applied Physics Letters, Vol. 56, p. 665 proposed a spin transistor based on the spin-orbital coupling of electrons to a gated electric field. Other types of spintronic devices are now sought to provide fast operation, low heat generation, and scalability down to nanometer sizes.

SUMMARY

In accordance with an aspect of the invention, a solid state amplifier injects spin-polarized electrons from one magnetic layer into another magnetic layer through a semiconductor layer, and a signal current flowing through an adjacent wire induces a magnetic field that causes precession of electron spin inside the semiconductor layer. The signal current thereby controls the magnitude of the current injected through the semiconductor region. Amplifiers of this type can be ultrafast and particularly can amplify electrical current, power, and/or electromagnetic oscillations down to millimeter wavelength.

In one specific embodiment of the invention, an amplifier includes a first magnetic region, a control region, a second magnetic region, and a wire. The first magnetic region has a first magnetization, and the second magnetic region has a second magnetization that is perpendicular to the first magnetization. The control region, which is typically a semiconductor region, forms a first interface with the first magnetic region and a second interface with the second magnetic region. The interfaces permit spin-polarized electrons to cross between the first magnetic region and the second magnetic region through the control region. The wire is positioned relative to the control region so that a current through the wire creates in the control region a magnetic field that rotates spins of the electrons injected through the control region between the first magnetic region and the second magnetic region.

In accordance with another specific embodiment of the invention, a method for amplifying a signal current, includes: applying a voltage difference between a first magnetic region and a second magnetic region that respectively form a first interface and a second interface with a semiconductor region that is between the first and second magnetic regions; driving the signal current through a wire that is adjacent to the semiconductor region to create a magnetic field that rotates spins of electrons injected through the semiconductor region between the first magnetic region and the second magnetic region; and extracting an amplified current from a current that flows between the first magnetic region and the second magnetic region.

BRIEF DESCRIPTION OF THE DRAWINGS

Use of the same reference symbols in different figures indicates similar or identical items.

DETAILED DESCRIPTION

In accordance with an aspect of the invention, an amplifier uses a magnetic field generated in a semiconductor control region by a signal current through a control nanowire to change the spin direction of electrons injected from one magnetic region through the semiconductor control region into another magnetic region. For effective signal amplification, the magnetic regions and the semiconductor region can have relatively large areas to conduct a spin injection current that is much greater than the signal current in the control nanowire. Such amplifiers are suitable for ultrafast current or power amplification and for electromagnetic oscillations down to millimeter wavelengths.

Figure 1A:
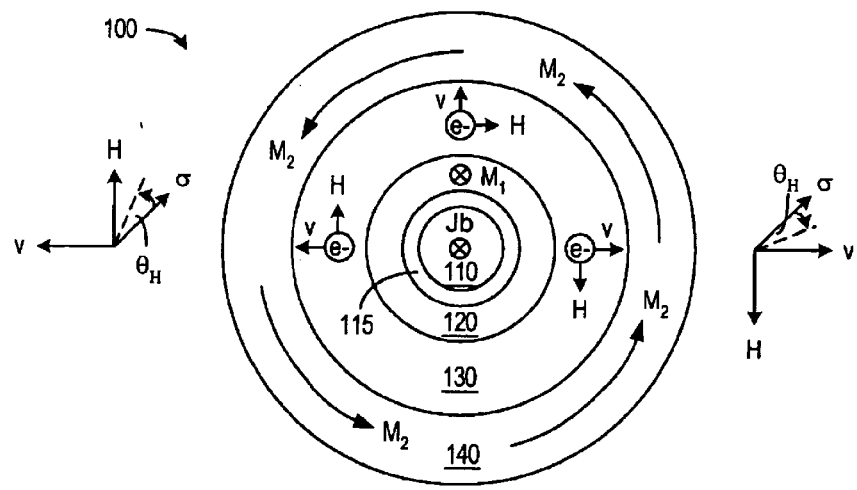
FIGS. 1A and 1B are a cross-section and a perspective view of a spin injection amplifier in accordance with an embodiment of the invention having radial symmetry.
Figure 1B:
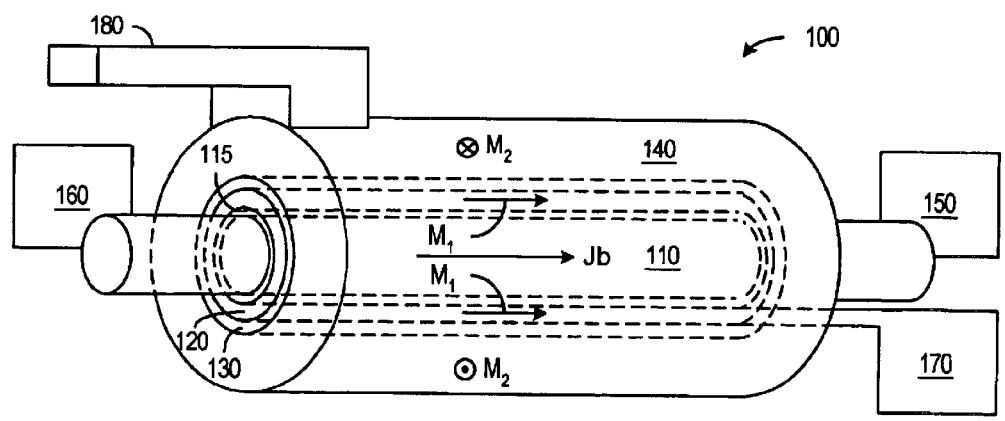

FIGS. 1A and 1B show an amplifier 100 in accordance with an embodiment of the invention. Amplifier 100 is cylindrically symmetric and is described here primarily to illustrate the principles of operation of a spin injection current amplifier. Amplifiers in accordance with embodiments of the invention that are easier to manufacture are described further below.

As shown in FIGS. 1A and 1B, amplifier 100 includes a highly conductive nanowire 110 encircled by a first magnetic layer 120, a semiconductor layer 130, and a second magnetic layer 140. Electrical terminals 150 and 160 contact the face planes (or ends) of nanowire 110, and electrical terminals 170 and 180 contact magnetic layers 120 and 140, respectively. A thin dielectric layer 115 is preferably but optionally between nanowire 110 and magnetic layer 120. Importantly, when dielectric layer 115 is employed, nanowire 100 can carry a signal or base current $J_b$ that is independent of the biasing of or the current through magnetic layer 120.

Magnetic layers 120 and 140 have permanent magnetizations $M_1$ and $M_2$, respectively. In the configuration of FIG. 1A, magnetization $M_1$ in magnetic layer 120 is parallel to the axis through the center of nanowire 110, and magnetization $M_2$ in magnetic layer 140 is directed at a right angle with magnetization $M_1$, along the circumference of the cylinder, thereby forming a vortex. In special circumstances, magnetization $M_2$ can alternatively be directed radially toward or away from the axis of nanowire 110. Other configurations that provide magnetizations $M_1$ and $M_2$ that are substantially perpendicular to each other would also be suitable for an amplifier as described further below.

Magnetic layers 120 and 140 can be biased so that electrons flowing through semiconductor layer 130 have a drift velocity v that is directed radially away from magnetic layer 120. An initial spin direction σ of the electrons depends on the magnetization ($M_1$ in FIGS. 1A and 1B) of the magnetic region providing conduction electrons. FIG. 1A shows the relative directions of drift velocity v and spin direction a of electrons relative to a magnetic field H induced by a base current $J_b$ flowing along nanowire 110 into the page of FIG. 1A.

Nanowire 110 may be formed from various highly conductive materials including heavily doped silicon or polysilicon and metals such as aluminum (Al), copper (Cu), silver (Ag), gold (Au), platinum (Pt), and tungsten (W) to name a few. Magnetic layers 120 and 140 may each be formed from various magnetic materials including: ferromagnetic elements iron (Fe), cobalt (Co), and nickel (Ni), various magnetic alloys and compounds, which may include one or a combination of Fe, Co, Ni, $CrO_2$ and $Fe_3O_4$; and magnetic semiconductors including but not limited to GaAs:Mn, GaN:Mn, ZnO, $CaB_6$, and $Ca_{1-z}La_xB_6$.

The semiconductor layer 130 may be formed from various semiconductor materials including Si, Ge, GaAs, ZnTe, GaSb, GaP, InAs, CdSe, InP, InSb, CdTe, CdS, ZnS, ZnSe, AlP, AlAs, AlSb, and also alloys and combinations of these materials. For reasons described further below, semiconductor layer 130 is preferably formed from a material with a relatively large electron spin relaxation time $\tau_S$. Some semiconductor materials that have long electron spin relaxation times include GaAs, GaAs, Ge, ZnSe, and ZnCdSe. Preferably, semiconductor layer 130 is also negatively doped.

Amplifier 100 operates based on the injection of spin-polarized electrons from one magnetic layer, e.g., magnetic layer 120, into the other magnetic layer, e.g., magnetic layer 140, through semiconductor layer 130, while a "base" current $J_b$ flowing along nanowire 110 induces a magnetic field H causing the spin direction of the electrons to precess inside semiconductor layer 130. For operation of amplifier 100, a base voltage $V_b$ is applied between electrical contacts 150 and 160, and an emitter voltage $V_e$ is applied between electrical contacts 170 and 180. These voltages can have arbitrary polarity. The following describes an exemplary operating bias in which contacts 150 and 170 are grounded and positive voltages $V_b$ and $V_e$ are applied to contacts 160 and 180, respectively. For the exemplary biasing, magnetic layer 120 under the action of positive emitter voltage $V_e$ on magnetic layer 140 will inject spin-polarized electrons into magnetic layer 140 through semiconductor layer 130.

Dielectric layer 115 isolates nanowire 110 from magnetic layer 120, so that an electrical circuit (e.g., terminal 160, nanowire 110, and terminal 150) for base current $J_b$ is electrically separated from an electrical circuit (e.g., terminal 180, magnetic layer 140, semiconductor layer 130, magnetic layer 120, and terminal 170) for an emitter current $J_e$. The conductivity of the emitter circuit is much higher than the conductivity of the base circuit due to the geometry of amplifier 100, i.e., the area of semiconductor layer 130, which conducts the emitter current is much larger than the cross-sectional area of nanowire 110 as shown in FIG. 1B. In particular, nanowire 110 may have a diameter on the order of a few tens of nanometers, while magnetic layer 140 has a length on the order of one micron or more.

Amplifier 100 controls injection of spin-polarized electrons through semiconductor layer 130, and therefore requires that the spin of the electrons predominantly remain coherent during transit across semiconductor layer 120. Accordingly, a transit time $\tau_T$ of the electrons traversing semiconductor layer 130 should not exceed the spin-relaxation time $\tau_S$, i.e., the time of spin coherence of electrons in semiconductor layer 130. In other words, spin ballistic transport is desired. Theoretical calculations and experimental studies indicate that the longest values for spin-relaxation time $\tau_S$ can be realized in negatively-doped (i.e., n-type) semiconductors and can reach up to 1 ns in materials such as ZnSe and GaAs at room temperature.

Transit time $\tau_T$ for electrons crossing semiconductor layer 130 is equal to the ratio of the thickness d of semiconductor layer 130 and the drift velocity v of the electrons traversing semiconductor layer 130. The drift velocity v in turn depends on the applied electric field E, the electron mobility $\mu_n$, and the diffusion constant $D_n$ in semiconductor layer 130 as indicated in Equation (1) below. From Equation (1), the condition that transit time $\tau_T$ be less than spin-relaxation time $\tau_S$ limits the maximum thickness $d_{max}$ of semiconductor layer 130 for spin ballistic transport as indicated in Equation (2). The maximum thickness $d_{max}$ is typically less than about 1 μm for a suitable semiconductor material such as n-type ZnSe or GaAs, but the thickness d of semiconductor layer 130 between magnetic layers 120 and 140 is preferably greater than 10 nm but less than 100 nm.

$$v = \mu_n \bar{E} + D_n/d \quad (1)$$

$$\tau_t \leq \tau_s, \text{ or } d < d_{max} = \sqrt{D_n \tau_s} + \tau_s \mu_n E \quad (2)$$

Transit time $\tau_T$, determines the operating speed of the device. In particular, the maximum operating frequency $\omega_0 = 2\pi f_0$ of the device is about $2\pi/\tau_T$. With transit time $\tau_T$ typically being less than 0.01 ns when semiconductor layer 130 is about 10 nm thick, an operating frequency $\omega_0$ greater than 100 GHz can be achieved.

The conductivity G between magnetic layers 120 and 140, i.e., between electrical terminals 170 and 180 generally depends on an angle θ between spin directions of electrons in semiconductor layer 130 near the magnetic layer 140 and the magnetization in the magnetic layer 140. The spin-polarized electrons are injected from magnetic layer 120, which determines the spin directions of injected electrons. Equation (3) indicates the conductivity G between magnetic layers 120 and 140 when semiconductor layer 130 is sufficiently thin that the spin polarization of the electrons traversing semiconductor layer 130 remain coherent. In particular, Equation (3) is valid when semiconductor layer 130 is relatively transparent for electron tunneling or when the spin ballistic transport is realized, i.e., the condition of Equation (2) is fulfilled.

$$G = G_0(1+P_1P_2\cos\theta) = G_0[1+P_1P_2\cos(\theta_0+\theta_H)] \quad (3)$$

In Equation (3), constant $G_0$ has units of conductance $(\Omega^{-1})$ and depends on the geometry and dimensions of amplifier 100 and on the material properties of semiconductor layer 130. Parameters $P_1$ and $P_2$ represent the degrees of spin polarization of electrons crossing the first and second magnetic-semiconductor (M-S) interfaces. Thus, the parameter $P_1$ represents the spin polarization of the current of electrons entering semiconductor layer 130 from magnetic layer 120, and parameter $P_2$ is the spin polarization of the current of conduction electrons entering magnetic layer 140 from semiconductor layer 130.

Angle θ in Equation (3) is the angle between the spin direction of spin polarized electrons in semiconductor layer 130 near the magnetic layer 140 and the magnetization $M_2$ in magnetic layer 140. The spin-polarized electrons are injected from the magnetic layer 120, which determines the spin directions of injected electrons. Thus magnetizations $M_1$ and $M_2$ in magnetic layer 120 and magnetic layer 140 control the direction of spin-polarized conduction electrons crossing into or from semiconductor layer 130. Absent spin rotation in semiconductor layer 130, angle θ is equal to the angle $\theta_0$ between magnetizations $M_1$ and $M_2$. When accounting for a rotation of the spins of electrons traversing semiconductor layer 130, angle θ is equal to the sum $\theta_0+\theta_H$ where angle $\theta_0$ is the angle between the magnetizations $M_1$ and $M_2$ of magnetic layers 120 and 140 and angle $\theta_H$ is the amount of spin rotation in semiconductor layer 130.

Magnetic layers 120 and 140 in amplifier 100 have magnetizations $M_1$ and $M_2$ that are substantially perpendicular to each other, thus making angle $\theta_0$ about equal to π/2 radians. With angle $\theta_0$ equal to π/2, Equation (3) simplifies to the form of Equation (4) for amplifier 100 and further simplifies to the form of Equation (5) if spin rotation angle $\theta_H$ is sufficiently small.

$$G = G_0(1+P_1P_2\sin\theta_H) \quad (4)$$

$$G = G_0(1+P_1P_2\theta_H) \quad (5)$$

Rotation angle $\theta_H$ depends on magnetic field H in semiconductor layer 130. In particular, base voltage $V_b$ drives the base current $J_b$ that flows along nanowire 110 and induces a radially symmetrical magnetic field H in semiconductor layer 130. Equation (6) indicates the magnitude of magnetic field H in terms of base current $J_b$ and a radial distance ρ from the center of nanowire 110. When base current $J_b$ is greater than 25 mA and radius ρ in semiconductor layer 130 is less than about 40 nm, the magnitude of magnetic field H will be greater than about 1000 Oe.

$$H = J_b/2\pi\rho \quad (6)$$

The spins σ of the injected spin-polarized electrons precess in magnetic field H during transit through semiconductor layer 130. The spin rotation of an electron in a magnetic field H is well known to have an angular frequency $\gamma H_n$ where the electron gyromagnetic ratio in vacuum γ is about $1.76\times10^7 \text{Oe}^{-1}\text{s}^{-1}$ or $2.2\times10^5$ (m/A)s$^{-1}$ and field component $H_n$ is the magnetic field component normal to the spin. In device 100, magnetic field H remains perpendicular to the spin direction, and component $H_n$ is equal to the magnitude of magnetic field H. The rotation angle $\theta_H$ for the spin of an electron crossing semiconductor layer 130 is thus approximately given in Equations (5), where a variable $k_j$ is a gain factor, which is introduced to simplify Equation (5). The factor g below is the gyromagnetic factor, which is close to 2 in vacuum but may have a different value in the solid matrix of semiconductor layer 130.

$$\theta_H = \frac{g}{2}\gamma\tau_t H = \frac{g}{2}\gamma\tau_t J_b(t)/2\pi p \equiv k_j J_b(t), \quad (7)$$

$$k_j \equiv g\gamma\tau_t/4\pi p$$

The conductivity G of amplifier 100 as indicated above thus depends on the base current $J_b$. When a constant emitter voltage $V_e$ is applied, the emitter current $J_e$ through amplifier 100 is equal to the product of emitter voltage $V_e$ and the conductivity G as indicated in Equation 8. Rotation angle $\theta_H$ of Equation (7) can be inserted into Equation (5) for a small rotation angle $\theta_H$ to re-express Equation (8) in terms of the base current $J_b$. Equation (8) indicates that the variable component of emitter current $J_e$ is proportional to rotation angle $\theta_H$ and therefore to base current $J_b$. In Equation (8), the current $J_{e0}$ is equal to the product of conductivity constant $G_0$ and emitter voltage $V_e$, and parameters $P_1$ and $P_2$ are the degrees of spin polarization at the semiconductor-magnet interfaces. Variable $k_J$ was introduced for Equation (7) and can be evaluated at a radial distance $\rho_S$ that is a typical radius of semiconductor layer 130 (i.e., $k_J = \gamma\tau_t/2\pi\rho_s$). Equation (8) indicates that amplifier 100 behaves as an amplifier having a current gain $K_J$ given in Equation (9).

$$J_e = GV_e \approx J_{e0}(1+P_1P_2\theta_H) = J_{e0}(1+P_1P_2k_J J_b) \quad (8)$$

$$K_J = \partial J_e/\partial J_b = J_{e0}P_1P_2k_J \quad (9)$$

Equation (9) and particularly the dependence of variable $k_J$ on radial distance $\rho_S$ in semiconductor layer 130 indicate that very thin nanowires 110 and 120, i.e., with the radius $\rho_0$ less than 50 mm can provide a larger current gain. Indeed, variable $k_J$ is larger than $10^3$ A$^{-1}$ when semiconductor radius $\rho_S$ is less than 50 nm and transit time $\tau_T$ is greater than $10^{-10}$ s, and current gain $K_J$ can be very large for ultrahigh angular frequency $2\pi/\tau_T$ greater than 100 GHz even when the product of spin fractions $P_1P_2$ is as small as 0.1. (In a typical ferromagnetic metal like Fe, Co, or Ni, the spin polarization parameter $P_1$ or $P_2$ is about 0.4 to 0.5).

Figure 2A:
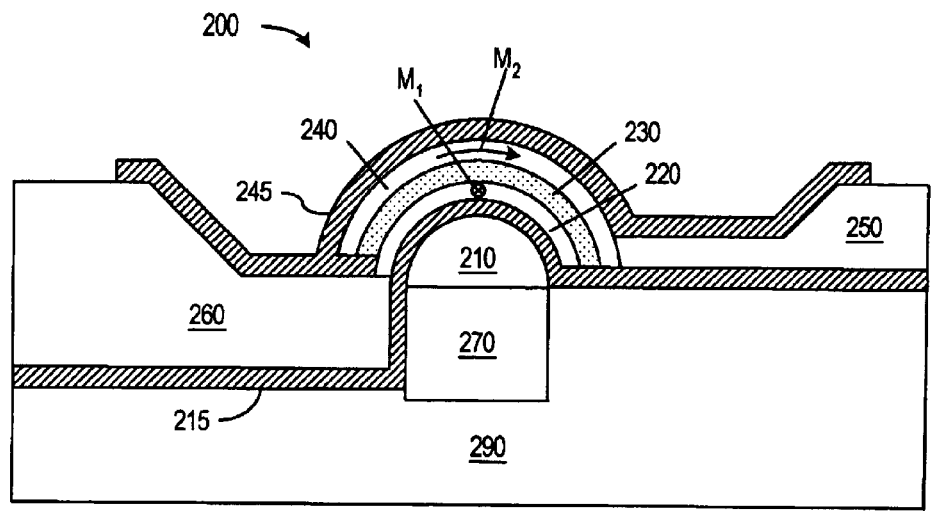
FIGS. 2A and 2B are a cross-section and a perspective view of a spin injection amplifier in accordance with an embodiment of the invention having a half-cylindrical nanowire.
Figure 2B:
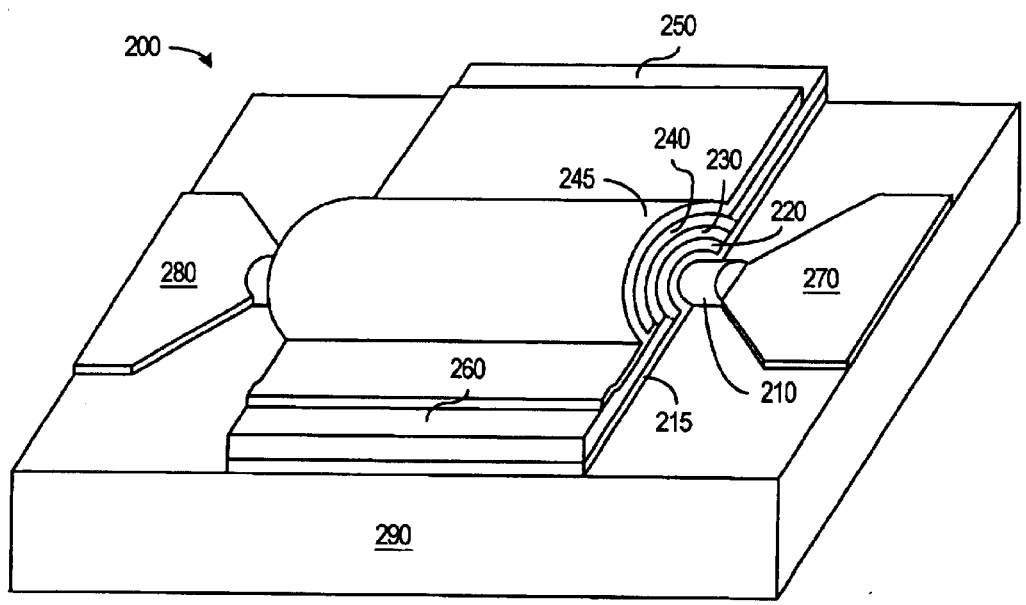

FIGS. 2A and 2B show a cross-sectional view and a perspective view of a spin-injection amplifier 200 according to an embodiment of the present invention that is easier to manufacture than is amplifier 100. As shown in FIGS. 2A and 2B, amplifier 200 includes a conductive near-semicircular nanowire 210 covered by a dielectric layer 215, a first magnetic layer 220, a semiconductor layer 230, and a second magnetic layer 240. Amplifier 200 also includes electrical terminals 250 and 260 respectively contacting magnetic layers 220 and 240 and electrical terminals 270 and 280 contacting face planes (i.e., the ends) of nanowire 210. The composition of each of the elements 210, 215, 220, 230, 240, 250, 260, 270, and 280 can be the same as described above for corresponding elements 110, 115, 120, 130, 140, 150, 160, 170, and 180 of amplifier 100. Magnetic layers 220 and 240 have fixed magnetizations $M_1$ and $M_2$ that are substantially perpendicular to each other.

A base current $J_b$ along nanowire 210 creates in semiconductor layer 230 a magnetic field H that is about equal to that found in amplifier 100 described above, when dimensions, materials, and currents of the devices are about the same. Accordingly, an emitter current $J_e$ that flows between magnetic layers 220 and 240 through semiconductor layer 230 for a constant emitter voltage $V_e$ will thus depend on base current $J_b$ in nanowire 210 in substantially the same manner as indicated in Equations (8) and (9) above, and amplifier 200 therefore operates as a current amplifier.

Both the radii $\rho_O$ and $\rho_S$ of semicircular nanowire 210 and semiconductor layer 230, respectively, are preferably less than 100 nm, with obviously $\rho_O < \rho_S$. The length of nanowire 210 can be on the order of about 0.1 $\mu$m or more but is more generally limited by acceptable maximum resistance of nanowire 210. The thickness $d_1$ of magnetic layer 220 has to be less than $\rho_S$, and preferably less than a typical width L of a magnetic domain wall in the magnetic material, usually width L is about 10–50 nm. When magnetic layer 220 has a thickness $d_1$ less than the width L of a magnetic domain but greater than 3–5 nm, the magnetization $M_1$ of thin magnetic film 220 lies in the film plane and can be directed along an axis of nanowire 210. The magnetization $M_2$ of magnetic film 240 also lies in the film plane but is directed clockwise along the semi-cylindrical surface of magnetic layer 240 in FIG. 2A, thus forming a semi-vortex. The thickness d of semiconductor layer 230 between magnetic layers 220 and 240 is preferably greater than 10 nm but less than 100 nm. The thickness w of dielectric layer 215 between nanowire 210 and magnetic layer 220 is preferably greater than 1 to 2 nm to isolate nanowire 210 from magnetic layer 220 but less than 10 to 20 nm so that the magnetic field H is strong in semiconductor layer 230. Since dielectric layer 215 isolates nanowire 210 from magnetic layer 220, the electrical circuits for base current $J_b$ and emitter current $J_e$ are independent. The conductivity $G_0$ of the emitter circuit in amplifier 200 is much higher than the conductivity of the base circuit merely from geometry (i.e., the areas) of layers 220, 230, and 240 in amplifier 200.

In a fabrication process for amplifier 200, a substrate 290 is prepared to contain underlying conductive contacts such as part of terminals 260, 270, and 280. The underlying contacts can be made of a conductive material such as a metal or a highly doped region of semiconductor material. Regions of insulating dielectric 215 can be provided in substrate 290 where required to isolate the conductive structures.

A layer of highly conductive material is then deposited on substrate 290 and patterned to form nanowire 210 (e.g. about 10 to 100 nm wide) in an area isolated from the contacts in substrate 290. The patterned material can be made by press forming and can be heated or otherwise liquefied so beading provides the desired shape to nanowire 210. U.S. Pat. No. 6,432,740, which is incorporated by reference in its entirety, describes a suitable method for forming a nanowire of the appropriate size, but other methods could alternatively be used. Additional portions of thin dielectric layer 215 are then grown and/or deposited on nanowire 210. Magnetic layer 220 is deposited to overlie dielectric layer 215 and nanowire 210 and to extend laterally far enough to make good contact with underlying terminal 260.

A portion of an insulating layer 245 is formed on terminal 260 before semiconductor layer 230 is deposited on magnetic layer 220, and a magnetic layer 240 is formed on semiconductor layer 230. Insulating layer 245 electrically insulates magnetic layer 220 and semiconductor layer 230 from terminal 260. A metal layer or other conductive layer forming terminal 250 is deposited in electrical contact with magnetic layer 240. The remainder of insulating dielectric layer 245 can then be deposited to provide insulation with openings for electrical connections to terminals 250, 260, 270, and 280.

Figure 3A:
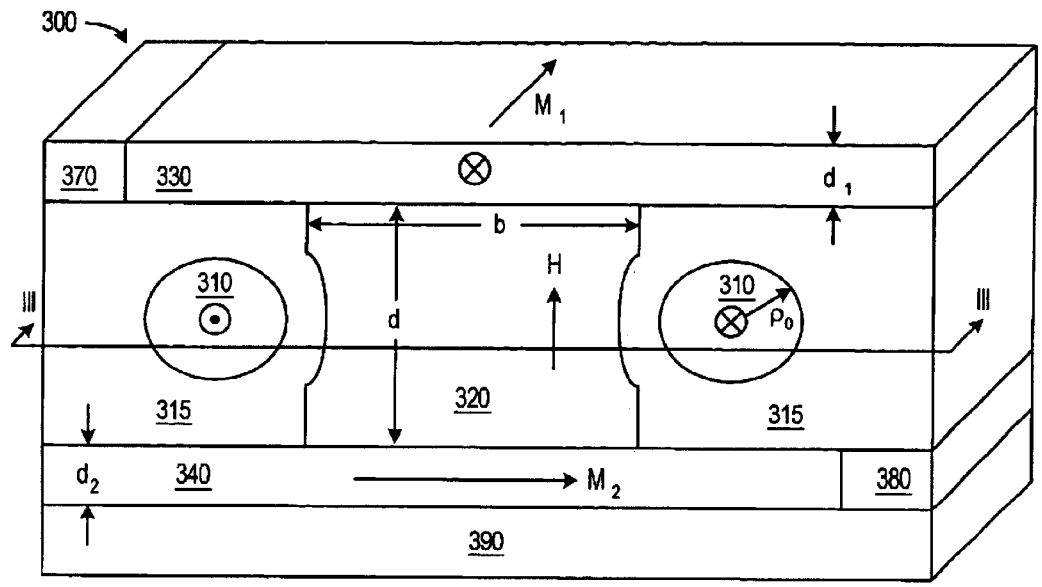
FIGS. 3A and 3B show cross-sections of a spin injection amplifier in accordance with an embodiment of the invention having vertically spaced magnetic regions and a U-shaped nanowire.
Figure 3B:
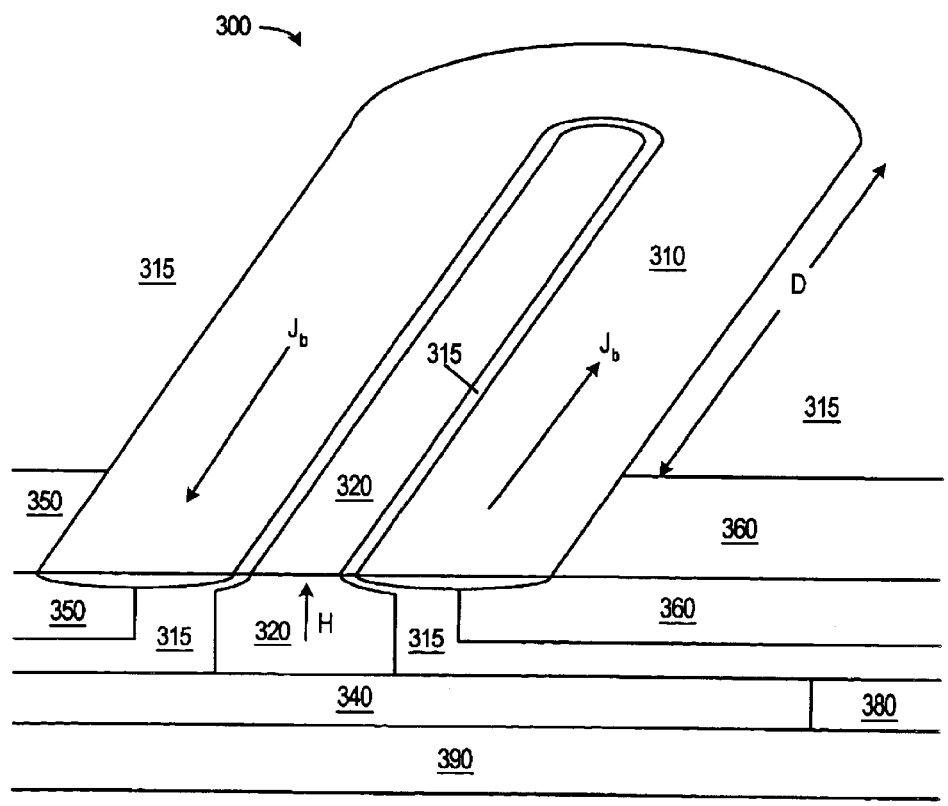
Figure 3C:
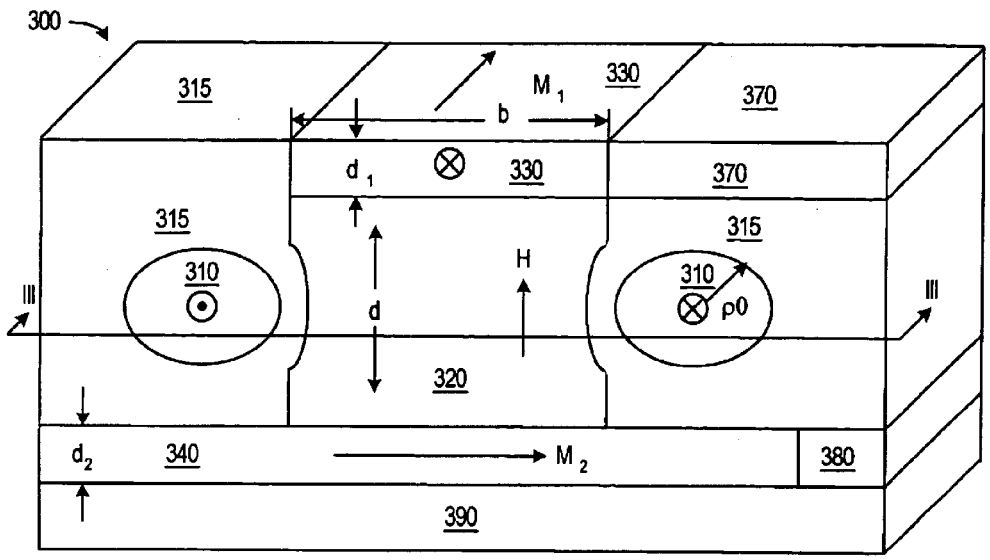
FIG. 3C shows a cross-section of a spin injection amplifier in accordance with another embodiment of the invention having a U-shaped nanowire.

FIGS. 3A and 3B illustrate a spin injection current amplifier 300 according to an embodiment of the invention employing a U-shaped control nanowire 310. FIG. 3A is a cross-section of amplifier 300, and FIG. 3C shows a cutaway view of amplifier 300, cut along line III—III in FIG. 3A.

As shown in FIGS. 3A and 3B, amplifier 300 includes two series-connected parallel sections that together form nanowire 310. A thin semiconductor region 320 is between the parallel sections of nanowire 310, which are horizontally separated in FIG. 3A. Semiconductor region 320 is also sandwiched between two magnetic regions 330 and 340, which are vertically separated in FIG. 3A. A dielectric layer 315 surrounds the active sections of nanowire 310, isolating nanowire 310 from semiconductor region 320 and magnetic regions 330 and 340.

The series connection of the parallel sections of nanowire 310 cause the signal current $J_b$ to flow in one direction in one parallel section of nanowire 310 and flow in the opposite direction in the other parallel section. Both parallel sections thus contribute to the magnetic field H in semiconductor region 320, and the magnitude of magnetic field H in semiconductor region 320 is about twice the magnetic field at the same distance from a single nanowire carrying the signal current $J_b$. The magnetic field H in semiconductor regions 320 is substantially vertical (e.g., up for a base current $J_b$ having the illustrated directions in FIG. 3A). The magnetization $M_1$ of magnetic layer 330 is in a plane of magnetic layer 330, so that magnetic layer 330 provides conduction electrons predominantly having a spin direction that is substantially perpendicular to the magnetic field H. Similarly, the magnetization $M_2$ can be in a plane of magnetic layer 340 but should also be perpendicular to magnetization $M_1$ for amplifier 300 to operate as substantially as described above in regard to amplifier 100 of FIGS. 1A and 1B.

The cutaway view of FIG. 3B shows electrical terminals 350 and 360 contacting the ends of nanowire 310. As shown, dielectric layer 315 can insulate terminals 350 and 360 from semiconductor region 320, magnetic region 340, and terminal 380. FIG. 3A shows electrical terminals 370 and 380 contacting magnetic films 330 and 340, respectively.

The size of semiconductor region 320 in amplifier 300 controls the size of the interfaces with magnetic regions 330 and 340. Accordingly, the size of magnetic regions 330 and 340 and the location of contacts 370 and 380 can be varied without significantly changing the performance of amplifier 300. In amplifier 300 of FIG. 3A, both magnetic regions 330 and 340 are much wider than the width b of semiconductor region 320, and terminals 370 and 380 are on opposite sides of semiconductor region 320. FIG. 3C illustrates one alternative configuration in which magnetic region 330 is about the same size as semiconductor region 320 and terminals 370 and 380 are on the same side (e.g., to the right) of semiconductor region 320. Other variations are clearly possible.

As noted above, magnetization $M_1$ is substantially perpendicular to magnetization $M_2$, and magnetizations $M_1$ and $M_2$ may lie in the respective planes of magnetic layers 330 and 340. Fabricating magnetic regions with magnetizations $M_1$ and $M_2$ in the plane of the regions is easiest when magnetic regions 330 and 340 are thin, e.g., when their thicknesses $d_1$ and $d_2$ are less than the domain wall width 14 in the magnetic materials used. Making the width b of magnetic film 330 less than domain wall width $L_0$, but larger than 3–5 nm, as in the structure presented in FIG. 3C (when $L_0>b>5$ nm), generally orients magnetization $M_1$ along the length of magnetic regions 330. Magnetization $M_1$, generally orients along the length of magnetic strap 330, in the structure of FIG. 3C. Magnetization $M_2$, which is perpendicular to magnetization $M_1$, is preferably pinned to the perpendicular direction by a standard method of using anti-ferromagnetic pinning layer 390 made from an anti-ferromagnetic material such as FeMn, IrMn, NiO, MnPt ($L1_0$), or $\alpha$-$Fe_2O_3$.

The radius $\rho_0$ of nanowire 310, as well as the thickness d and width b of the semiconductor layer 320, should be preferably greater than 10 nm but less 50 nm to provide a strong magnetic field and spin coherent transmission of electrons. The thickness of the dielectric layer 315 between the semiconductor layer 320 and nanowire 310 should be greater than 1 to 2 nm to isolate nanowire 310 from semiconductor layer 320 and magnetic films 330 and 340 and less than 30 nm to provide a strong magnetic field in semiconductor region 320. Under these conditions, electrical circuits of the base current $J_b$ and the emitter current $J_e$ are separated. The large size of the interfaces between semiconductor region 320 and magnetic regions 330 and 340 (extending along the length D of the active sections of U-shaped nanowire 310) causes the conductivity $G_0$ of the emitter circuit, i.e., between terminals 370 and 380, to be much higher than the conductivity of the base circuit between base terminals 350 and 360.

A fabrication process for amplifier 300 starts with a substrate having an anti-ferromagnetic layer 390 that defines a direction for magnetization $M_2$. A thin magnetic layer 340 having a thickness less than domain wall width $L_0$ but greater than 3–5 nm is deposited on anti-ferromagnetic layer 390 to provide desired magnetization $M_2$. Magnetic layer 340 can then be patterned, and a metal contact 380 can be formed.

A semiconductor layer is deposited on magnetic layer 340 and patterned to form semiconductor region 320 of the desired dimensions. A thin conformal layer of an insulator can then be deposited/grown on magnetic layer 340 and/or semiconductor region 320, before depositing and patterning the conductive material for nanowire 310. Although nanowire 310 is shown to have a rounded cross-section, the shape of the cross-section of nanowire 310 will generally depend on the formation technique and can have a form close to rectangle with end chamfer. Alternatively, nanowire 310 can be formed as two inverted trapezoids joined along the wide bases. Further insulating material for dielectric layer 315 can then be deposited on nanowire 310 and planarized by etchback or chemical mechanical polishing (CMP), at the level corresponding to the top of semiconductor region 320.

Magnetic region 330 having the desired magnetization $M_1$ is formed on semiconductor region 320 and with possible extension onto dielectric layer 315. Terminal 370 can then be formed overlying dielectric layer 315 and in contact with magnetic region 330. Openings in dielectric layer 315 can also be formed to permit electrical contact to terminal 380 and to the ends of nanowire 310.

Figure 4:
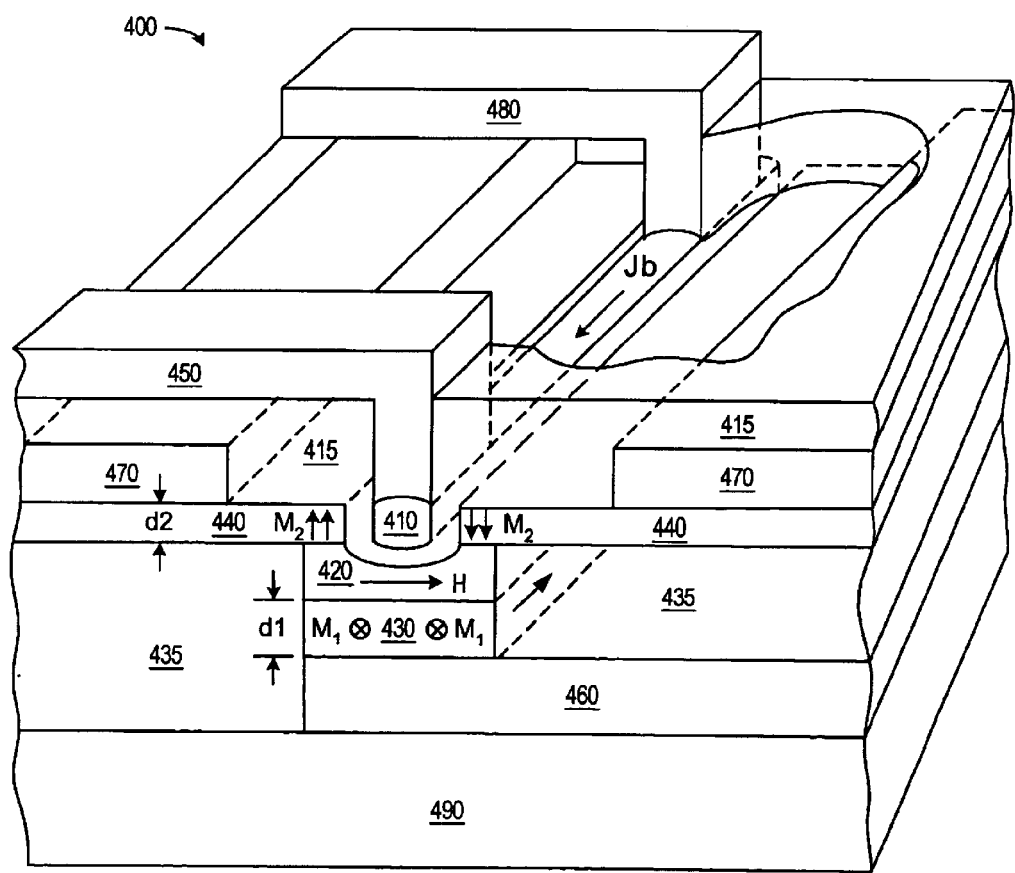
FIG. 4 is a perspective view of a spin injection amplifier in accordance with an embodiment of the invention having vertically spaced magnetic regions and a straight nanowire.

FIG. 4 shows a spin injection amplifier 400 in accordance with another embodiment of the invention employing a straight nanowire 410. As shown in FIG. 4, nanowire 410 is surrounded and covered by a dielectric layer 415 and overlies a thin semiconductor layer 420. Nanowire 410 is also between two regions of a magnetic layer 440. Another magnetic layer 430 is under semiconductor layer 420. Amplifier 400 further includes electrical terminals 450 and 460 that contact the face planes (or ends) of the nanowire 410 through openings in dielectric layer 415. An overlying terminal 470 connects to both regions of magnetic layer 440, and an underlying terminal 480 contacts magnetic layer 430.

The typical dimensions for cross-sections of nanowire 410 and semiconductor layer 420 are less than about 100 nm but larger than 10 nm.

In amplifier 400, dielectric layer 415 separates nanowire 410, which forms the base circuit, from the emitter circuit including magnetic layer 430, semiconductor region 420, and magnetic layer 440. The thickness of the dielectric layer 415 between nanowire 410 and semiconductor layer 420 is generally greater than 1 nm but much less than about 100 nm. Although nanowire 410 can be made of a highly conductive material such as highly doped silicon (Si) or poly-silicon or a metal such as Al, Cu, Pit, W, Au, or Ag, the conductivity $G_0$ of the emitter circuit is much higher than that of the base circuit because of the much greater area through which the emitter current can flow.

The magnetization $M_1$ in magnetic film 430 is perpendicular to the magnetizations $M_2$ in magnetic films 440. For example, magnetization $M_1$ may lie in the plane of magnetic layer 430, and magnetization $M_2$ may be perpendicular to the surface of magnetic layer 440. These conditions can be realized for ferromagnetic films 430 and 440, as a rule, when the thickness $d_1$ of the ferromagnetic film 430 are equal to or less than the domain wall width $L_0$, and the thickness $d_2$ of the ferromagnetic film 440 is larger than the domain wall width $L_0$.

The magnetizations $M_2$ in the right and left regions of magnetic films 440 may be parallel or antiparallel, and FIG. 4 shows an antiparallel configuration in which magnetization $M_2$ in the left region is directed upward and magnetization $M_2$ in the right region is directed downward. The two regions of magnetic layer 440 preferably have antiparallel magnetizations as shown in FIG. 4. In this case, the magnetic lines of static magnetic field at the ends of the two magnetic regions 40 are closed, and the magnetic field that a base current in nanowire 410 generates has directions that are substantially opposite at the interface with the two regions of magnetic layer 440.

Device 400 can be fabricated by first forming a conductive interconnect region 480 (e.g., a metal or highly doped semiconductor region) in or on a dielectric or semiconductor substrate 490. Interconnect region 480 will provide an electrical connection to the later formed magnetic region 430, which is deposited on interconnect region 460. An external contact (not shown) or connection to another device (not shown) on substrate 490 can be laterally separated from device 400. Semiconductor region 420 is deposited on magnetic region 430 and can be patterned using the same mask that also controls the dimensions of magnetic region 430. Dielectric regions 435 are then deposited around magnetic region 430 and semiconductor region 420.

Magnetic layer 440 can be deposited on semiconductor region 420 and adjacent dielectric regions 435, either as a single continuous layer or as separate regions having opposite magnetizations. However, formation of separate regions may be preferred when application of a magnetic field is required during deposition to control the magnetization. Alternatively, an antiferromagnetic thin pinning layer (e.g., on top of the film 440) can control the magnetization direction. Magnetic layers 440, like magnetic layer 430, can be formed of a ferromagnetic material or other material that has spin-polarized conduction electrons. Patterning of magnetic layer 440 exposes a central portion of semiconductor region 420 but leaves magnetic regions 440 in contact with outer portions of semiconductor region 420. Optionally, an etching process through the opening between magnetic regions 440 can create a depression in semiconductor region 420. A thin insulating layer and nanowire 410 are then formed in the opening between magnetic regions 440. The insulating layer becomes part of dielectric layer 415, which separates nanowire 410 from the emitter circuit and therefore permits use of highly conductive metals such as Al, Au, Pt, Ag, and Cu for nanowire 410.

In an alternative process flow, an initial insulating layer, nanowire 410, and a capping insulating layer can be formed on semiconductor region 420 before formation of magnetic layer 440. The magnetizations of the two separate magnetic regions can then be controlled during formation of magnetic layer 440.

Contacts to nanowire 410, magnetic region 430, and magnetic regions 440 can then be formed. In particular, metal contact 470 can be formed on magnetic regions 440 and covered with the remainder of dielectric layer 415. Openings can then be formed through dielectric layer 415 for contacts 450 and 480 to the opposite ends of nanowire 410.

Figure 5A:
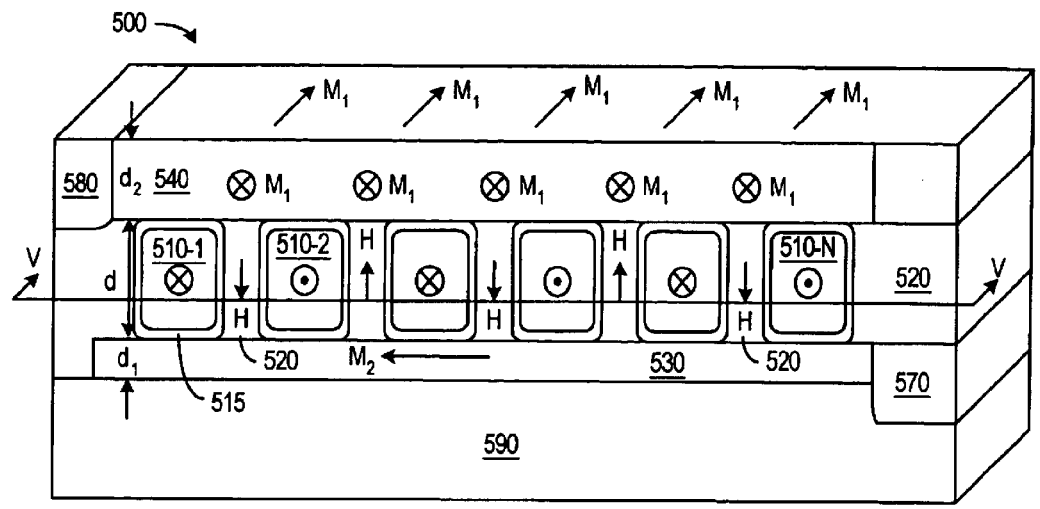
FIGS. 5A and 5B show cross-sections of spin injection amplifiers in accordance with an embodiment of the invention having a winding nanowire.
Figure 5B:
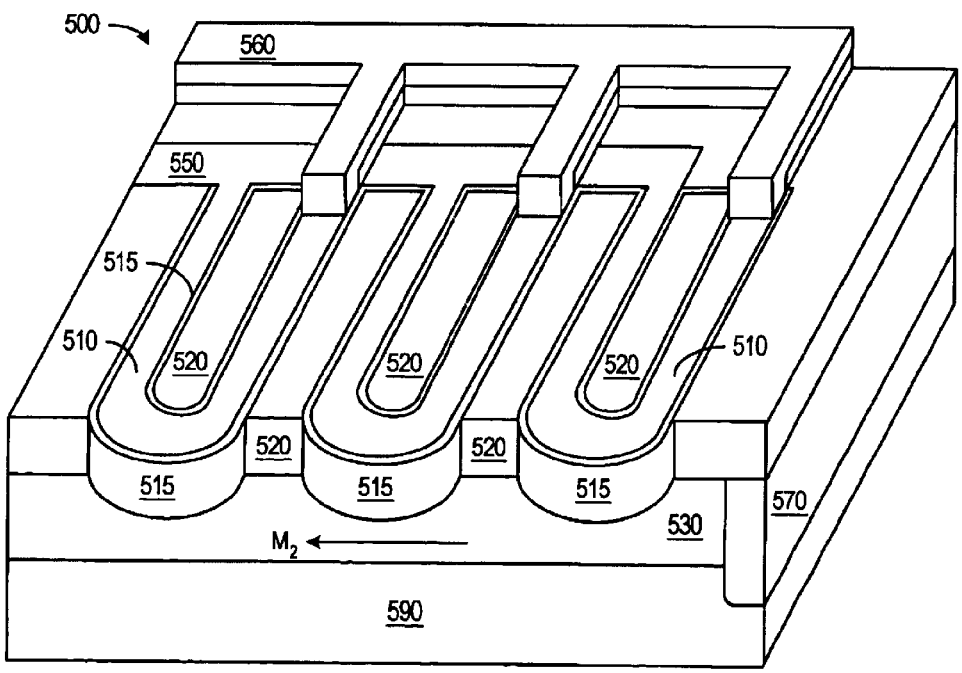

FIGS. 5A and 5B show a power current amplifier 500 in accordance with an embodiment of the invention having a nanowire 510 that includes multiple parallel segments. FIG. 5A shows a cross-section cut vertically through nanowire 510 in amplifier 500, and FIG. 5B shows a cross-section of amplifier 500 partially cut horizontally along the V—V line in FIG. 5A.

As shown in FIGS. 5A and 5B, nanowire 510 in amplifier 500 includes several parallel sections 510-1 to 510-N with each section being in series with an adjacent section, where the pairs of sections are connected in parallel between terminals 550 and 560. Thin semiconductor regions 520 are between parallel sections 510-1 to 510-N, and nanowire 510 and semiconductor regions 520 are sandwiched between two vertically separated magnetic films 530 and 540. A dielectric layer 515 separates nanowire 510 from semiconductor regions 520 and magnetic films 530 and 540.

Contacts 570 and 580 for the emitter circuit respectively provide electrical connections to magnetic layers 530 and 540, and contacts 550 and 560 for the base circuit provide electrical connections to nanowire 510. When a base voltage $V_b$ is applied across contacts 550 and 560, the resulting currents in nanowire sections 510-1 to 510-N alternate in direction as shown in FIG. 5A, so that adjacent nanowire sections reinforce the magnetic field in the intervening semiconductor regions 520. The emitter current that results from applying a fixed emitter voltage between contacts 570 and 580 will thus depend on the base current, but the emitter current can be significantly amplified because of the large area of semiconductor regions which conduct the emitter current between magnetic regions 530 and 540.

In the configuration shown in FIG. 5B, base voltage $V_b$, when applied to terminals 550 and 560, drives a base current $J_b$ that is split among the pairs of parallel nanowire sections. The splitting of the current reduces the resistance of the base circuit but also reduces the magnetic field strength in semiconductor regions 520 and therefore the spin rotation angle $\theta_H$. Alternatively, all of the parallel nanowire sections can be connected in series. A series connection has greater resistance but also permits the undivided base current to flow along each nanowire sections.

Figure 5C:
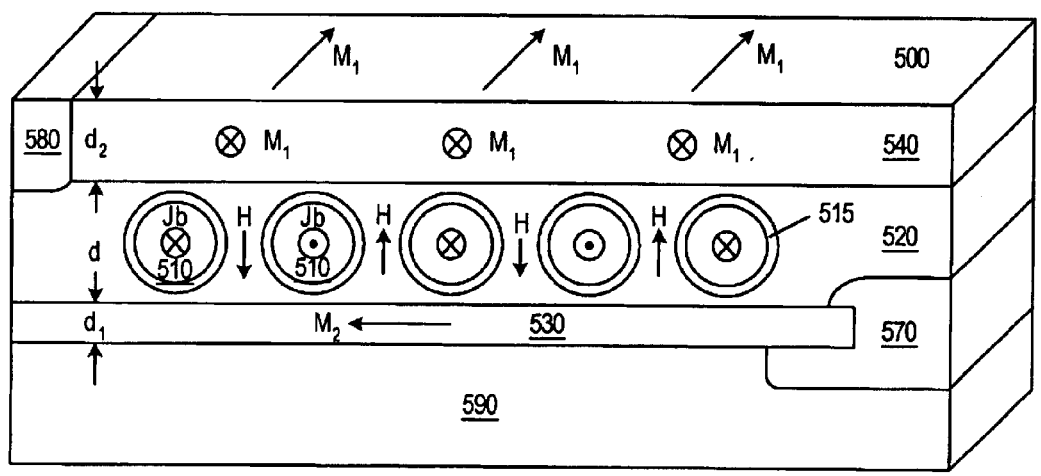
FIG. 5C shows an amplifier having a nanowire with an alternative shape when compared to the amplifier of FIG. 5A.

FIG. 5C shows a variation of amplifier 500 in which nanowire 510 has a circular cross-section instead of the squared cross-section shown in FIG. 5A.

A fabrication process for amplifier 500 can begin with formation of magnetic layer 530 and its associated contact 570 in and on a substrate 590. A semiconductor layer can then be deposited/patterned to form semiconductor regions 520 and leave a trench for nanowire 510 and one of contacts 550 and 560. A thin insulating layer can be grown or deposited in the trench, leaving space for a conductive material that is deposited to form nanowire 510. A capping insulating layer can be formed on nanowire 510 before the structure is etched back or planarized to expose the tops of semiconductor regions 520. Magnetic layer 540 is formed on semiconductor regions 520. Electrical contacts to nanowire 510 and magnetic layers 530 and 540 can be laterally spaced from each and made through openings in an insulating layer (not shown).

The magnetization $M_1$ in film 530 is preferably perpendicular to the magnetization $M_2$ in film 540, and magnetizations $M_1$ and $M_2$ preferably lie in the plane of films 530 and 540. To achieve this, the thicknesses $d_1$ and $d_2$ of magnetic films 530 and 540 can be made equal to or less than the width $L_0$ of a domain wall in the magnetic materials used in films 530 and 540, so that the magnetization will lie in the plane of the films, being forced in there by the magnetostatic interactions. The magnetization $M_2$ in magnetic film 530 is preferably pinned by an antiferromagnetic pinning layer in substrate 590.

The typical size $\rho_0$ of cross-section of nanowire 510 and the thickness d of the semiconductor layer 520 may be equal to or less than 100 nm. The thickness of the dielectric layers 515 between semiconductor layers 520 and nanowires 510 should be greater than 1 to 2 nm but less than 30 nm.

Although the invention has been described with reference to particular embodiments, the description is only an example of the invention's application and should not be taken as a limitation. Many additions or variations can be applied in the disclosed amplifiers. For example, antiferromagnetic layers made of a material such as FeMn, IrMn, NiO, MnPt ($L1_0$), or $\alpha$-$Fe_2O_3$ can be added to fix the directions of magnetizations $M_1$ and $M_2$ in the magnetic films. One anti-ferromagnetic layer may be added between the substrate (e.g., substrates 390, 490 and 590) and the lower magnetic film (e.g., magnetic layers 340, 430 and 530), and another anti-ferromagnetic layer may be formed on the upper magnetic film (e.g., magnetic layers 330, 440 and 540).

Additionally, when ferromagnetic metals Ni, Fe, and/or Co are used as magnetic layers in the amplifier structures described above, so-called δ-doped layers, which are semiconductor layers that are extremely thin and very heavily doped with n-type dopants, may be formed between semiconductor and magnetic layers, i.e., the δ-doped layers may be located inside the ferromagnetic-semiconductor junction. The specifications of the δ-doped layers are formulated in U.S. patent application Ser. No. 10/284,183, filed Oct. 31, 2002, entitled: "Efficient Spin-Injection Into Semiconductors" and U.S. patent application Ser. No. 10/284,360, filed Oct. 31, 2002, entitled: "Magnetic Sensor Based on Efficient Spin Injection into Semiconductor".

Various other adaptations and combinations of features of the embodiments disclosed are within the scope of the invention as defined by the following claims.

What is claimed is:

1. An amplifier comprising:
a first magnetic region having a first magnetization;
a control region forming a first interface with the first magnetic region;
a second magnetic region forming a second interface with the control region, the second magnetic region having a second magnetization that is substantially perpendicular to the first magnetization; and
a wire positioned relative to the control region so that a current through the wire creates in the control region a magnetic field that rotates spins of the electrons injected through the control region between the first magnetic region and the second magnetic region.

2. The amplifier of claim 1, further comprising:
a first terminal connected to the first magnetic region;
a second terminal connected to the second magnetic region; and
a third terminal and a fourth terminal connected to ends of the wire, wherein a signal applied to the third and fourth terminals controls a current between the first and second terminals.

3. The amplifier of claim 1, wherein the control region is such that an electron spin relaxation time of the control region is longer than a transit time of the electrons traversing the control region.

4. The amplifier of claim 1, wherein the control region comprises a semiconductor material.

5. The amplifier of claim 4, wherein the semiconductor material is selected from a group consisting of Si, Ge, GaAs, GaInAs, Ge, ZnSe, ZnCdSe, and alloys and combinations of these materials.

6. The amplifier of claim 4, wherein the semiconductor material contains an n-type doping.

7. The amplifier of claim 1, wherein the first magnetic region comprises a ferromagnetic material.

8. The amplifier of claim 1, wherein the wire has a cross-sectional dimension less than 100 nm.

9. The amplifier of claim 1, wherein the control region has a thickness less than 100 nm.

10. The amplifier of claim 1, further comprising a substrate wherein:
the wire comprises a conductive region on the substrate;
the first magnetic region overlies the conductive region;
the control region overlies the first magnetic region; and
the second magnetic region overlies the control region.

11. The amplifier of claim 10, further comprising an insulating layer between the conductive region and the first magnetic region.

12. The amplifier of claim 11, wherein the insulating layer has a thickness that is greater than 2 nm and less than 20 nm.

13. The amplifier of claim 1, further comprising a substrate wherein:
the first magnetic region is on the substrate;
the control region overlies the first magnetic region; and
the second magnetic region overlies the control region.

14. The amplifier of claim 13, wherein the substrate comprises an anti-ferromagnetic material that is under the first magnetic region and that fixes the direction of the first magnetization.

15. The amplifier of claim 13, wherein the wire comprises a first segment adjacent a first side of the control region.

16. The amplifier of claim 15, wherein the wire further comprises a second segment adjacent a second side of the control region.

17. The amplifier of claim 16, wherein the first segment and the second segment are connected in series such that current in the first segment has a direction opposite to current in the second segment.

18. The amplifier of claim 13, wherein:
the control region comprises a plurality of parts, wherein each part is laterally separated from an adjacent part, and
the wire comprises a plurality of segments that reside in separations between the parts of the control region.

19. The amplifier of claim 18, wherein the segments are connected such that current in each of the segments has a direction opposite to current in an adjacent one of the segments.

20. The amplifier of claim 13, wherein the second magnetic region comprises a first part and a second part that are laterally separated from each other, the wire having a segment residing in a separation between the first and second parts of the second magnetic region.

21. The amplifier of claim 20, wherein the first part of the second magnetic region has the second magnetization and the second part of the second magnetic region has a magnetization that is antiparallel to the second magnetization.

22. The amplifier of claim 20, wherein the first part and the second part of the second magnetic region have the second magnetization.

23. A method for amplifying a signal current, comprising:
applying a first voltage difference between a first magnetic region and a second magnetic region that respectively form a first interface and a second interface with a semiconductor region that is between the first and second magnetic regions;
rotating spins of electrons injected through the semiconductor region between the first magnetic region and the second magnetic region by driving the signal current through a wire that is adjacent to the semiconductor region; and
extracting an amplified current from a current resulting from injection between the first magnetic region and the second magnetic region.

24. The method of claim 23, wherein the first magnetic region has a first magnetization, the second magnetic region has a second magnetization, and the first magnetization is perpendicular to the second magnetization.

25. The method of claim 23, wherein the semiconductor region is such that an electron spin relaxation time of the semiconductor region is longer than a transit time of the electrons traversing the semiconductor region.

26. The method of claim 23, wherein driving the signal current comprises applying a voltage difference between terminals at opposite ends of the wire.

27. The method of claim 23, wherein the wire has a cross-sectional dimension less than 100 nm.

28. The method of claim 23, wherein the wire comprises a plurality of segments that reside in separations between parts of the semiconductor region.

29. The method of claim 28, wherein the segments are connected such that current in each of the segments has a direction opposite to the current in an adjacent one of the segments.

* * * * *